(12) United States Patent
Lavoie et al.

(10) Patent No.: US 9,105,571 B2
(45) Date of Patent: Aug. 11, 2015

(54) INTERFACE ENGINEERING TO OPTIMIZE METAL-III-V CONTACTS

(75) Inventors: Christian Lavoie, Pleasantville, NY (US); Uzma Rana, Chappaqua, NY (US); Devendra K. Sadana, Pleasantville, NY (US); Kuen-Ting Shiu, White Plains, NY (US); Paul Michael Solomon, Yorktown Heights, NY (US); Yanning Sun, Scarsdale, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 13/368,750

(22) Filed: Feb. 8, 2012

(65) Prior Publication Data

US 2013/0200443 A1    Aug. 8, 2013

(51) Int. Cl.
| H01L 21/24 | (2006.01) |
| H01L 21/225 | (2006.01) |
| H01L 21/285 | (2006.01) |
| H01L 29/417 | (2006.01) |
| H01L 29/45 | (2006.01) |
| H01L 29/66 | (2006.01) |
| H01L 29/20 | (2006.01) |

(52) U.S. Cl.
CPC ...... *H01L 21/2258* (2013.01); *H01L 21/28575* (2013.01); *H01L 29/41783* (2013.01); *H01L 29/452* (2013.01); *H01L 29/66522* (2013.01); *H01L 29/20* (2013.01); *H01L 2924/0002* (2013.01)

(58) Field of Classification Search
CPC ..... H01L 21/182; H01L 21/22; H01L 21/244; H01L 21/246; H01L 21/3245; H01L 21/242; H01L 21/28575

USPC .......................................... 438/305, 306, 572
See application file for complete search history.

(56) References Cited

U.S. PATENT DOCUMENTS

| 4,795,717 | A * | 1/1989 | Okamura ...................... 438/171 |
| 2003/0230753 | A1 * | 12/2003 | Steckl et al. .................... 257/89 |
| 2005/0118770 | A1 * | 6/2005 | Nandakumar et al. ........ 438/305 |
| 2008/0122341 | A1 * | 5/2008 | Orita et al. .................... 313/503 |
| 2009/0236634 | A1 * | 9/2009 | Moriya et al. ................. 257/190 |
| 2009/0305471 | A1 * | 12/2009 | Chang et al. .................. 438/154 |

(Continued)

OTHER PUBLICATIONS del Alamo et al., "The Prospects for 10 nm III-V CMOS," VLSI Technology Systems and Applications (VLSI-TSA), 2010 International Symposium, pp. 166-167 (Apr. 2010).

(Continued)

*Primary Examiner* — Kevin Parendo
(74) *Attorney, Agent, or Firm* — Louis J. Percello; Michael J. Chang, LLC

(57) ABSTRACT

Techniques for fabricating self-aligned contacts in III-V FET devices are provided. In one aspect, a method for fabricating a self-aligned contact to III-V materials includes the following steps. At least one metal is deposited on a surface of the III-V material. The at least one metal is reacted with an upper portion of the III-V material to form a metal-III-V alloy layer which is the self-aligned contact. An etch is used to remove any unreacted portions of the at least one metal. At least one impurity is implanted into the metal-III-V alloy layer. The at least one impurity implanted into the metal-III-V alloy layer is diffused to an interface between the metal-III-V alloy layer and the III-V material thereunder to reduce a contact resistance of the self-aligned contact.

19 Claims, 8 Drawing Sheets

(56) References Cited

U.S. PATENT DOCUMENTS

2011/0121400 A1\* 5/2011 Larrieu et al. ................ 257/369
2011/0227225 A1\* 9/2011 Edelstein et al. ............. 257/751
2012/0291835 A1\* 11/2012 Lu et al. ........................ 136/244

OTHER PUBLICATIONS

Kim et al., "Self-aligned metal Source/Drain InxGa1-xAs n-MOSFETs using Ni—InGaAs alloy," IEDM 2010.

\* cited by examiner

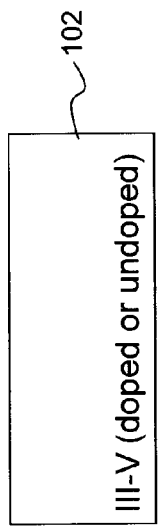
FIG. 1
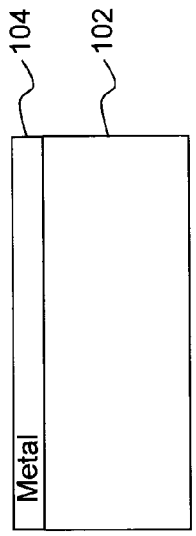
FIG. 2
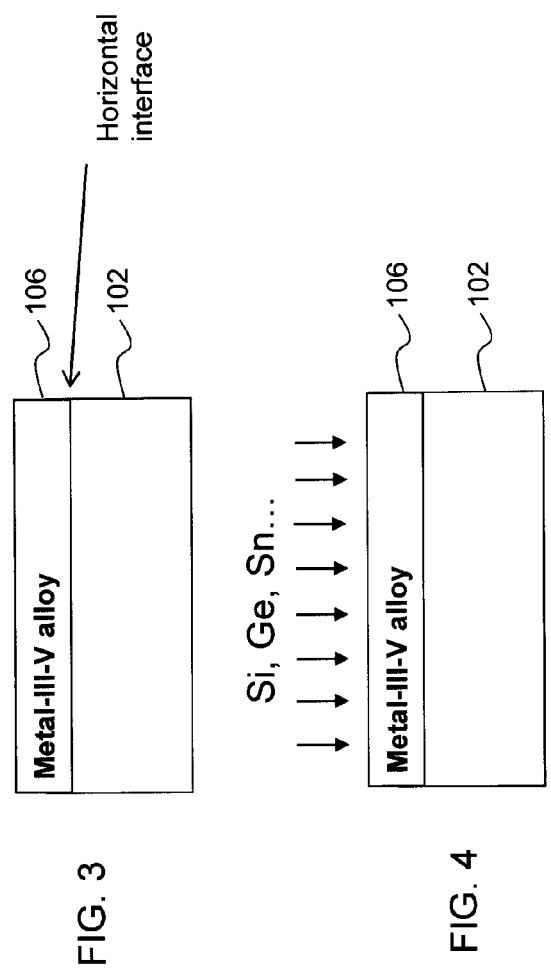
FIG. 3
FIG. 4

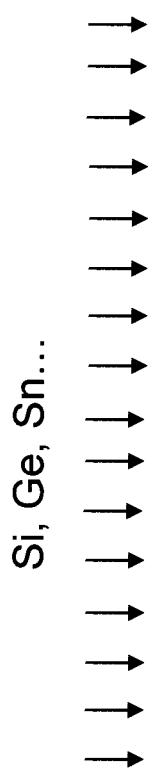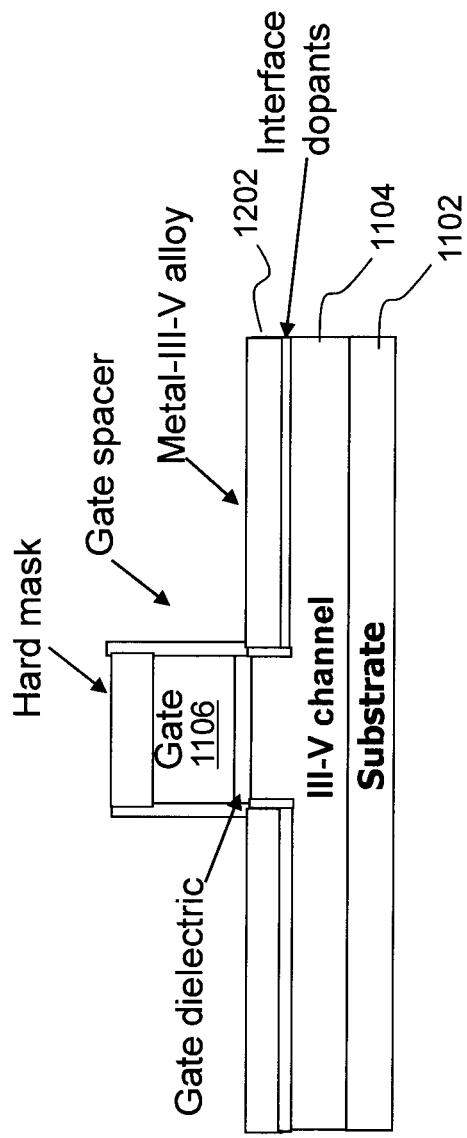
FIG. 13
FIG. 14

US 9,105,571 B2

INTERFACE ENGINEERING TO OPTIMIZE METAL-III-V CONTACTS

FIELD OF THE INVENTION

The present invention relates to III-V semiconductor field-effect transistors (FET) devices and more particularly, to techniques for fabricating self-aligned contacts in III-V FET devices.

BACKGROUND OF THE INVENTION

Due to their favorable electron transport properties, the use of III-V semiconductor materials (i.e., materials that include at least one group III element and at least one group V element) has been proposed for future generations of metal oxide semiconductor field-effect transistor (MOSFET) devices. See, for example, del Alamo et al., "The Prospects for 10 nm III-V CMOS," VLSI Technology Systems and Applications (VLSI-TSA), 2010 International Symposium, pgs. 166-167 (April 2010) (hereinafter "del Alamo").

There are, however, some notable challenges associated with the fabrication of III-V FET devices. For instance, with the aggressive scaling requirements of current CMOS technology, self-aligned contact schemes with low contact resistance are needed. However, no such techniques currently exist to achieve these goals. For example, III-V FET devices with self-aligned contacts were demonstrated in Kim et al., "Self-aligned metal Source/Drain In$_x$Ga$_{1-x}$As n-MOSFETs using Ni—InGaAs alloy," IEDM 2010 (hereinafter "Kim"), however, they resulted in a very large external resistance, i.e., 38.7 kilo-ohm-micron$^2$ (kΩµm) in the case of In$_{0.53}$Ga$_{0.47}$As. The best contact resistance achieved for In$_{0.8}$Ga$_{0.2}$As with bandgap less than 0.5 electron volt (eV) was 2.73 kΩµm (see, e.g., del Alamo), which results in poor performance of 4 microamps per micrometer (µA/µm) for 500 nanometer (nm) devices.

Therefore, improved techniques for producing self-aligned contacts in III-V semiconductor FET devices would be desirable.

SUMMARY OF THE INVENTION

The present invention provides techniques for fabricating self-aligned contacts in III-V semiconductor field-effect transistor (FET) devices. In one aspect of the invention, a method for fabricating a self-aligned contact to III-V materials is provided. The method includes the following steps. At least one metal is deposited on a surface of the III-V material. The at least one metal is reacted with an upper portion of the III-V material to form a metal-III-V alloy layer which is the self-aligned contact. An etch is used to selectively remove any unreacted portions of the at least one metal. At least one impurity is implanted into the metal-III-V alloy layer. The at least one impurity implanted into the metal-III-V alloy layer is diffused to an interface between the metal-III-V alloy layer and the III-V material thereunder to reduce a contact resistance of the self-aligned contact.

In another aspect of the invention, a method of fabricating a FET device is provided. The method includes the following steps. At least one layer of a III-V channel material is deposited on a substrate. A gate is formed over the III-V channel material. Spacers are formed on opposite sides of the gate. At least one metal is deposited on a surface of the III-V channel material. The at least one metal is reacted with an upper portion of the III-V material to form metal-III-V alloy layers adjacent to the gate which serve as self-aligned source and drain contacts of the device. An etch is used to selectively remove any unreacted portions of the at least one metal. At least one impurity is implanted into the metal-III-V alloy layers. The at least one impurity implanted into the metal-III-V alloy layers is diffused to an interface between the metal-III-V alloy layers and the III-V material thereunder to reduce a contact resistance of the self-aligned source and drain contacts.

In yet another aspect of the invention, A FET device is provided. The FET device includes at least one layer of a III-V channel material on a substrate; a gate over the III-V channel material; spacers on opposite sides of the gate; metal-III-V alloy layers formed in an upper portion of the III-V material adjacent to the gate which serve as self-aligned source and drain contacts of the device; and at least one implanted impurity at an interface between the metal-III-V alloy layers and the III-V material thereunder, wherein the at least one implanted impurity serves to reduce a contact resistance of the self-aligned source and drain contacts.

A more complete understanding of the present invention, as well as further features and advantages of the present invention, will be obtained by reference to the following detailed description and drawings.

BRIEF DESCRIPTION OF THE DRAWINGS

FIG. 1 is a cross-sectional diagram illustrating a layer of a III-V semiconductor material according to an embodiment of the present invention;

FIG. 2 is a cross-sectional diagram illustrating a metal(s) having been deposited on the III-V semiconductor material according to an embodiment of the present invention;

FIG. 3 is a cross-sectional diagram illustrating an anneal having been performed to react the metal(s) with an upper portion of the III-V material to form a metal-III-V alloy layer and wherein unreacted portions of the metal(s) are etched away by selective etch according to an embodiment of the present invention;

FIG. 4 is a cross-sectional diagram illustrating at least one impurity such as (but not limited to) Si, Ge and/or Sn having been implanted into the metal-III-V alloy layer according to an embodiment of the present invention;

FIG. 13 is a cross-sectional diagram illustrating at least one impurity such as Si, Ge and/or Sn having been implanted into the metal-III-V alloy layer according to an embodiment of the present invention;

FIG. 14 is a cross-sectional diagram illustrating an anneal having been used to diffuse the implanted impurity/impurities to an interface between the metal-III-V alloy layer and the underlying III-V material according to an embodiment of the present invention.

DETAILED DESCRIPTION OF PREFERRED EMBODIMENTS

Figure 5:
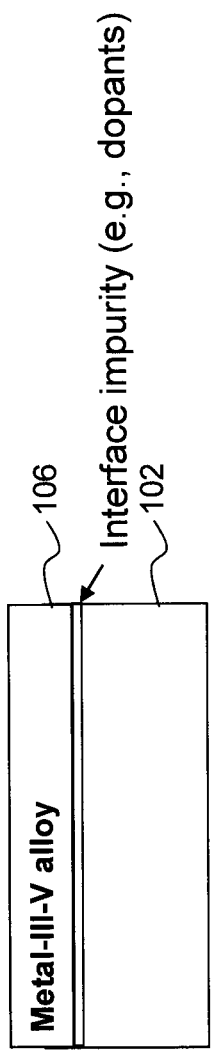
FIG. 5 is a cross-sectional diagram illustrating an anneal having been used to diffuse the implanted dopants to an interface between the metal-III-V alloy layer and the underlying III-V material according to an embodiment of the present invention.

Provided herein are techniques for fabricating self-aligned contacts in III-V field-effect transistor (FET) devices with low contact resistance which involve forming the self-aligned contacts from a metal-III-V material alloy and then implanting and diffusing an impurity/impurities (e.g., dopant(s)) to the metal-III-V alloy/III-V interface to reduce the contact resistance. A general description of the present techniques for forming a self-aligned contact to a III-V semiconductor material will first be presented by way of reference to FIGS. 1-5, followed by two exemplary device implementations in FIGS. 6-10 and 11-14, respectively, wherein self-aligned contacts are formed to a III-V channel material present in a MOSFET device.

FIG. 1 is a cross-sectional diagram illustrating a III-V semiconductor material 102. As will be described in detail below, in some embodiments presented herein the III-V material contains a single material (gallium arsenide for instance), while in other embodiments the III-V material is composed of several different materials, e.g., oriented as a stack of layers with each layer containing a different III-V material.

Further, as will be described in detail below, the III-V semiconductor material may constitute a channel material used in a MOSFET device. In one exemplary embodiment presented below, the III-V channel material is doped in order to form source and drain regions of the device. In another exemplary embodiment presented below, the III-V channel material remains undoped. Thus, as shown in FIG. 1, the III-V semiconductor material 102 may (or may not) be doped depending on the particular application at hand.

The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations including at least one of the foregoing materials. According to an exemplary embodiment, the III-V material 102 is indium gallium arsenide (InGaAs).

A metal or metals 104 is/are then deposited on the III-V material 102. See FIG. 2. By way of example only, the metal(s) 104 deposited in this step can include, but are not limited to, nickel, cobalt, titanium, platinum and combinations including at least one of the foregoing metals. According to an exemplary embodiment, the metal 104 is deposited using a technique such as (but not limited to) evaporation or sputtering. The amount of the metal 104 deposited is based on the thickness of the III-V material 102. Namely, as will be described in detail below, the metal 104 will be used to form an alloy (e.g., through annealing) with the III-V material 102 resulting in an interface between the alloy and the remaining III-V material.

Specific exemplary implementations will be described below, wherein the present techniques are employed to form self-aligned source and drain contacts in a III-V FET device. In that case, some or even all of the III-V material in the source and drain regions of the device may be reacted with the metal to form the alloy. In the situation where the III-V material is entirely consumed during the alloy-forming process, then the above-described interface will be a vertical interface between the alloy and the III-V material in the channel region. This specific case is described in further detail below. However, for the more general embodiment (shown, for example, in FIGS. 1-5) describing the present techniques, it is assumed that the alloy is formed using an upper portion of the III-V material 102 leaving a remaining portion of the III-V material below the alloy unreacted, and that the interface is formed between the alloy and the remaining III-V material. This interface is a horizontal interface between the alloy and the unreacted III-V material, as would be the case of a III-V FET device (as mentioned above, and described below) where the III-V material in the source and drain regions is not fully consumed in the alloy-forming process. Thus, in the case of a III-V FET device wherein a portion of the III-V material is left unreacted below the alloy, there is both a vertical and a horizontal interface present between the alloy and the unreacted III-V material. See, for example, FIGS. 8 and 12.

Next, an anneal of the metal 104/the III-V material 102 is performed to react the metal 104 with an upper portion of the III-V material 102 forming a metal-III-V alloy layer 106. See FIG. 3. According to an exemplary embodiment, the anneal using a process including, but not limited to, rapid thermal annealing (RTA), furnace anneal or laser anneal is performed at a temperature of from about 60 degrees Celsius (° C.) to about 800° C. (e.g., from about 80° C. to about 400° C.) for a duration of from about 1 milli-second to about 2 hours (e.g., from about 1 second to about 60 minutes). Any unreacted metal 104 can be selectively removed, for example, using a wet etch process. Suitable wet etching processes include, but are not limited to, hydrochloric acid (HCL), hydrofluoric acid, piranha (sulfuric acid ($H_2SO_4$) and hydrogen peroxide ($H_2O_2$)) or standard RCA clean. This metal deposition and annealing technique results in the formation of a self-aligned contact (i.e., formed without the use of a mask) since the metal-III-V alloy layer 106 (the contact) will form only where the metal 104 is deposited on the III-V material 102.

In order to reduce the contact resistance between the metal-III-V alloy layer 106 (the contact) and the underlying III-V material 102 (e.g., the channel material), an impurity or impurities will be placed at the interface between the metal-III-V alloy layer 106 and the underlying III-V material 102. This is accomplished by first implanting the impurity/impurities into the metal-III-V alloy layer 106. See FIG. 4. The term "impurity" as used herein refers generally to any element or elements that can be implanted into the metal-III-V alloy layer and diffused to the interface (see below) so as to reduce contact resistance. Dopants are considered to be one kind of impurity that can be used in accordance with the present techniques. By way of example only, in one exemplary embodiment, a dopant(s) including, but not limited to, silicon (Si), germanium (Ge), tin (Sn) and combinations including at least one of the foregoing elements, are employed as the impurity. Other impurities that have the right work function might also be used. These include, but are not limited to metals such as Erbium (Er), Ytterbium (Yb), Platinum (Pt) and combinations including at least one of the foregoing elements. Shallow implants are used to ensure that the impurity/impurities are confined to the metal-III-V alloy layer 106.

Next an anneal of the metal-III-V alloy layer 106 and the underlying III-V material 102 is used to diffuse the implanted impurity/impurities to the interface between the metal-III-V alloy layer 106 and the underlying III-V material 102. See FIG. 5. According to an exemplary embodiment, a rapid thermal annealing (RTA), furnace anneal, dynamic surface annealing (DSA) or laser spike annealing (LSA) process is employed. By way of example only, this annealing step is performed at a low temperature, e.g., from about 300° C. to about 600° C. (e.g., from about 350° C. to about 450° C.), for a duration of from about 1 milli-second to about 2 hours, e.g., from about 1 second to about 30 minutes. Use of a low temperature anneal at this phase ensures that there will be at most negligible diffusion of the impurity/impurities into the underlying III-V material 102. Therefore, the impurity/impurities will accumulate at the interface between the metal-III-V alloy layer 106 and the underlying III-V material 102. And beneficially, the low temperature anneal will not degrade III-V material 102 and gate dielectric (see below). By implanting the impurity/impurities at the interface between the metal-III-V alloy layer 106 and the underlying III-V material 102, the contact resistance is greatly reduced (e.g., as compared to conventional processes, such as those described in Kim, the contents of each of which are incorporated by reference herein).

As highlighted above, two exemplary implementations of the present techniques for forming self-aligned contacts with low contact resistance will be presented wherein the III-V material serves as a channel material of a FET device. The first example will be described by way of reference to FIGS. 6-10.

Figure 6:
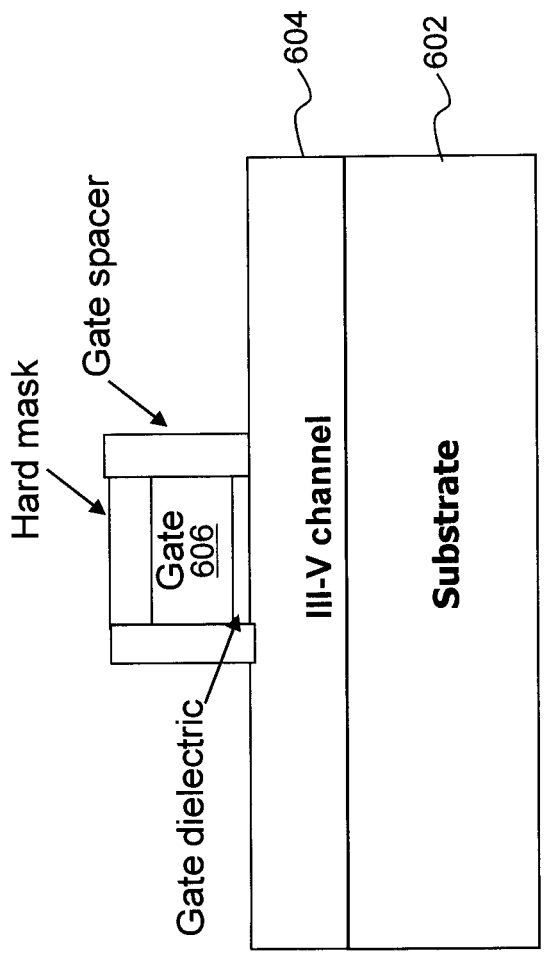
FIG. 6 is a cross-sectional diagram illustrating a III-V FET device for which self-aligned contacts with low contact resistance will be formed using the present techniques, the MOSFET device having a III-V channel material on a substrate and a gate over the III-V channel material according to an embodiment of the present invention.
Figure 7:
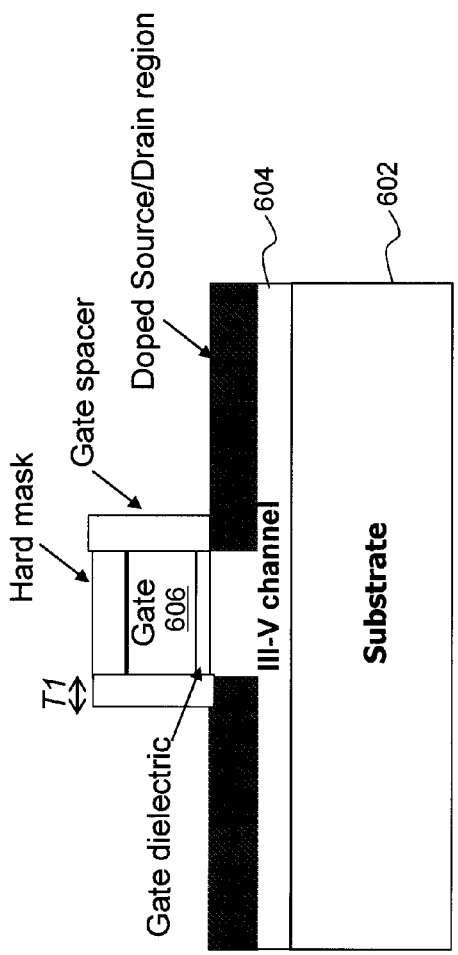
FIG. 7 is a cross-sectional diagram illustrating source and drain regions having been formed in the III-V channel material on opposite sides of the gate according to an embodiment of the present invention.

FIG. 6 is a cross-sectional diagram illustrating a III-V FET device (i.e., a FET device wherein the channel material is a III-V material) for which self-aligned contacts with low contact resistance will be formed using the present techniques. As shown in FIG. 6, the III-V FET device includes a substrate 602, a III-V material layer that serves as a channel of the device (hereinafter "III-V channel material 604") on the substrate 602 and a gate 606 over the III-V channel material 604. In general a FET includes a source region and a drain region interconnected by a channel (in this case a III-V material) and a gate that regulates electron flow through the channel.

According to an exemplary embodiment, substrate 602 is a glass, metal or plastic substrate. Substrate 602 may also be formed from a semiconducting material such as silicon or silicon germanium. By way of example only, the substrate 602 has a thickness of from about 100 μm to about 600 μm, e.g., about 500 μm.

Exemplary III-V materials were provided above. As described above, the III-V material may be deposited as a single layer (of gallium arsenide for instance), or as a stack of layers with each layer containing a different III-V material. According to an exemplary embodiment, the III-V channel material 604 (or materials in the case of multiple layers) is deposited on the substrate 602 using a chemical vapor deposition (CVD) process such as metalorganic CVD (MOCVD) or molecular beam epitaxy (MBE) to a thickness of from about 1 nm to about 5 m.

As shown in FIG. 6, the gate 606 may be separated from the III-V channel material 604 by an optional gate dielectric. According to an exemplary embodiment, the gate 606 is a metal gate (which is made up of a single or multiple metal layers as is known in the art) and the gate dielectric is a single layer of a gate dielectric material such as (but not limited to) hafnium oxide, or alternatively the gate dielectric is made up of multiple layers of different dielectric materials. To form the gate, the gate material is deposited and then standard lithography techniques are used to pattern the gate 606. For example, as shown in FIG. 6, a hardmask is used to pattern the gate line. As highlighted above, the gate material can be a metal or metals. Suitable gate metals include, but are not limited to titanium nitride (TiN), tantalum nitride (TaN), tungsten (W), gold (Au), titanium (Ti), aluminum (Al), platinum (Pt) and combinations including at least one of the foregoing metals.

As shown in FIG. 6, gate spacers are present on opposite sides of the gate 606. According to an exemplary embodiment, the spacers can be formed from a nitride material, such as (but not limited to) silicon nitride. Standard techniques are employed to form the spacers. For example, the spacer material can be blanket deposited over the structure and then patterned to form the spacers. According to an exemplary embodiment, the spacers are formed having a thickness t1 of from about 5 nm to about 30 nm.

In an alternative embodiment presented below, thinner spacers are employed so as to place the source drain contacts as close to the channel as possible. One of ordinary skill in the art would know how to tailor the spacer formation process in order to obtain spacers of a desired thickness.

Source and drain regions of the device are then formed by implanting a dopant(s) into the III-V channel material 604 adjacent to/on opposite side of the gate 606. See FIG. 7. By way of example only, suitable source/drain dopants include, but are not limited to, silicon (n-type) and carbon (p-type), wherein the particular dopant employed will depend on the device being formed (e.g., an n-channel FET or a p-channel FET, respectively). The implanted dopants can be activated using an anneal, for example, at a temperature of from about 400° C. to about 1,000° C.

Self-aligned source and drain contacts with low contact resistance are then formed using the techniques described in conjunction with the description of FIGS. 1-5, above. Namely, to begin this contact-formation process, a metal or metals is/are deposited onto the III-V channel material 604 in the source and drain regions.

As described in detail above, suitable metal(s) deposited in this step include, but are not limited to, nickel, cobalt, titanium and/or platinum. Suitable metal deposition techniques include, but are not limited to, an evaporation or sputtering technique, such as electron-beam (e-beam) evaporation. Next, as described above, an anneal is performed to react the metal with an upper portion of the III-V channel material 604 forming metal-III-V alloy layers 802 adjacent to the gate. See FIG. 8. According to an exemplary embodiment, the anneal using a process including, but not limited to, rapid thermal annealing (RTA), furnace anneal or laser anneal is performed at a temperature of from about 60° C. to about 800° C. (e.g., from about 80° C. to about 400° C.) for a duration of from about 1 milli-second to about 2 hours (e.g., from about 1 second to about 60 minutes).

Figure 8:
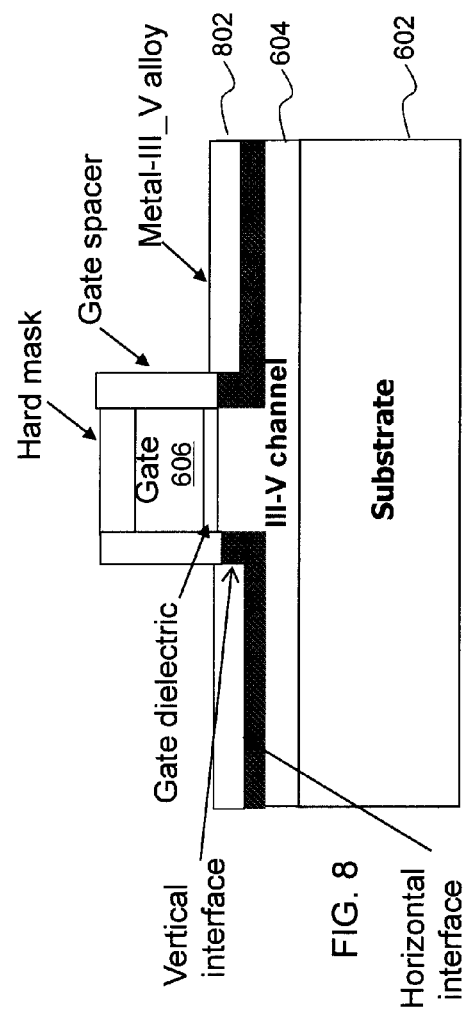
FIG. 8 is a cross-sectional diagram illustrating a metal(s) having been deposited onto the III-V channel material and then reacted (by annealing) with an upper portion of the III-V channel material forming a metal-III-V alloy layer, and wherein any unreacted portions of the metal(s) are etched away by selective etch according to an embodiment of the present invention.
Figure 9:
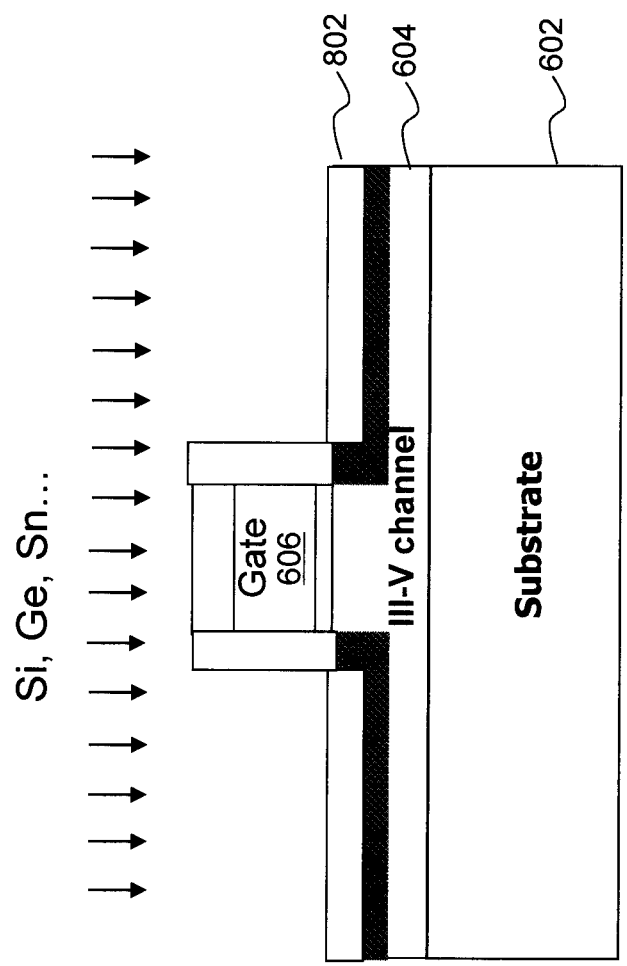
FIG. 9 is a cross-sectional diagram illustrating at least one impurity such as (but not limited to) Si, Ge and/or Sn having been implanted into the metal-III-V alloy layer according to an embodiment of the present invention.
Figure 10:
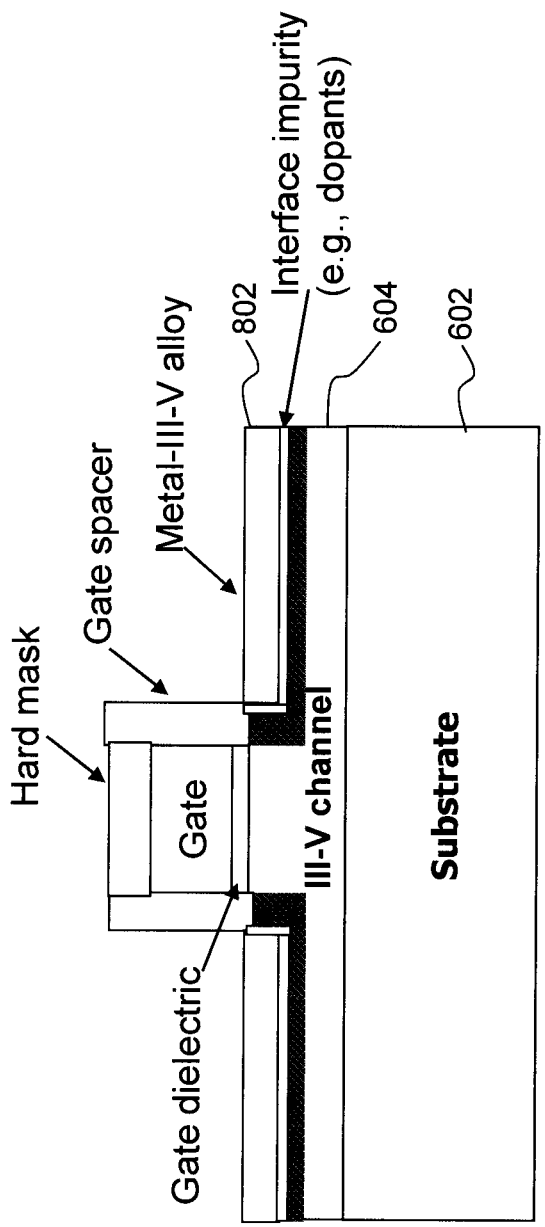
FIG. 10 is a cross-sectional diagram illustrating an anneal having been used to diffuse the implanted impurity/impurities to an interface between the metal-III-V alloy layer and the underlying III-V material according to an embodiment of the present invention.

As highlighted above, some or all of the III-V material in the source and drain regions may be reacted with the metal to form the metal-III-V alloy. The exemplary configuration wherein only a (top) portion of the III-V material in the source and drain regions has been reacted with the metal to form the metal-III-V alloy is shown in FIG. 8. As shown in FIG. 8, the result is that a horizontal interface is created between the metal-III-V alloy layer and the unreacted III-V material thereunder, as well as a vertical interface between the metal-III-V alloy layer and the III-V material in the channel region. Alternatively, in the case where all of the III-V material in the source and drain regions is reacted with the metal to form the metal-III-V alloy (not shown), then only the vertical interface between the metal-III-V alloy layer and the III-V material in the channel region would be present since the metal-III-V alloy layer would extend down to the substrate in the source and drain regions.

This metal deposition and annealing technique results in the formation of a self-aligned contact since the metal-III-V alloy layer 802 (the contact) will form only where the metal is deposited on the III-V channel material 604. Any unreacted metal can be removed, for example, using a wet etch process (such as hydrochloric acid (HCL), hydrofluoric acid, piranha (sulfuric acid ($H_2SO_4$) and hydrogen peroxide ($H_2O_2$)) or standard RCA clean.

In order to reduce the contact resistance between the metal-III-V alloy layer 802 (the contact) and the underlying III-V material 604 (e.g., the channel material), an impurity/impurities will be placed at the interface between the metal-III-V alloy layer 802 and the underlying III-V material 604. This is accomplished by first implanting the impurity/impurities into the metal-III-V alloy layer 802. See FIG. 9. As highlighted above, the term "impurity" as used herein refers generally to any element or elements that can be implanted into the metal-III-V alloy layer and diffused to the interface (see below) so as to reduce contact resistance. Dopants are considered to be one kind of impurity that can be used in accordance with the present techniques. By way of example only, in one exemplary embodiment, a dopant(s) including, but not limited to, silicon (Si), germanium (Ge), tin (Sn) and combinations including at least one of the foregoing elements, is/are employed as the impurity. Other impurities that have the right work function might also be used. These include, but are not limited to metals such as Erbium (Er), Ytterbium (Yb), Platinum (Pt) and combinations including at least one of the foregoing elements. Shallow implants are used to ensure that the impurity/impurities are confined to the metal-III-V alloy layer 802.

Next an anneal is used to diffuse the implanted impurity/impurities to the interface between the metal-III-V alloy layer 802 and the underlying III-V material 604. See FIG. 10. According to an exemplary embodiment, a RTA, furnace anneal, DSA or LSA annealing process is employed. As highlighted above, this annealing step is performed at a low temperature, e.g., from about 300° C. to about 600° C. (e.g., from about 350° C. to about 450° C.), for a duration of from about 1 milli-second to about 2 hours, e.g., from about 1 second to about 30 minutes, so as to ensure that there will be at most negligible diffusion of the impurity/impurities into the underlying III-V material 604. Therefore, the impurity/impurities will accumulate at the interface between the metal-III-V alloy layer 802 and the underlying III-V material 604. By segregating the impurity/impurities at the interface between the metal-III-V alloy layer 802 and the underlying III-V material 604, the contact resistance is greatly reduced (e.g., as compared to conventional processes, such as those described in del Alamo and Kim, the contents of each of which are incorporated by reference herein). The FET device is now complete.

A second example is now provided for forming self-aligned contacts with low contact resistance wherein the III-V material serves as a channel material of a FET device. This second example will be described by way of reference to FIGS. 11-14. In this example, Schottky type source and drain contacts will be formed. Thus source and drain region doping is not needed (compared for example with FIG. 7, described above).

Figure 11:
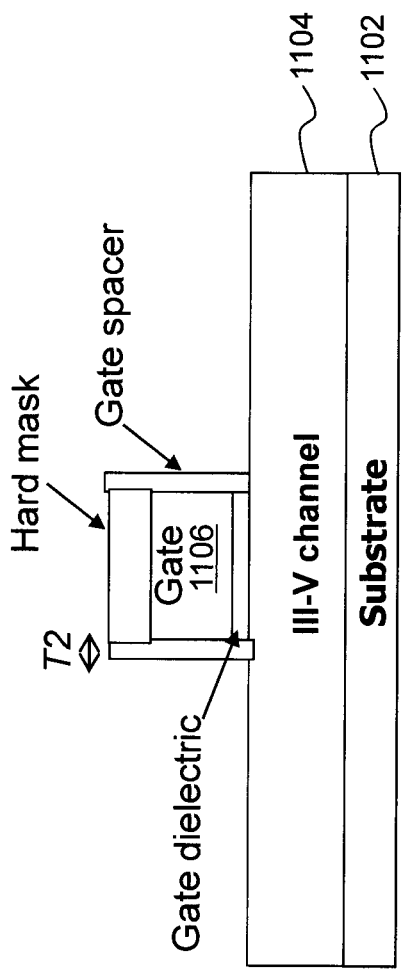
FIG. 11 is a cross-sectional diagram illustrating another III-V FET device for which self-aligned contacts with low contact resistance will be formed using the present techniques, the MOSFET device having a III-V channel material on a substrate and a gate over the III-V channel material according to an embodiment of the present invention.

FIG. 11 is a cross-sectional diagram illustrating a III-V FET device (i.e., a FET device wherein the channel material is a III-V material) for which self-aligned contacts with low contact resistance will be formed using the present techniques. As shown in FIG. 11, the III-V FET device includes a substrate 1102, a III-V material layer that serves as a channel of the device (hereinafter "III-V channel material 1104") on the substrate 1102 and a gate 1106 over the III-V channel material 1104.

According to an exemplary embodiment, substrate 1102 is formed from a semiconducting material (or materials consisting of multiple layers of oxides and semiconductor layers) such as silicon or silicon germanium, or a III-V material on an oxide.

Exemplary III-V materials were provided above. As described above, the III-V material may be deposited as a single layer (of gallium arsenide for instance), or as a stack of layers with each layer containing a different III-V material. According to an exemplary embodiment, the channel material 1104 (or materials in the case of multiple layers) is deposited on the substrate 1102 using a process such as (but not limited to) MOCVD or MBE to a thickness of from about 2 nm to about 5 μm. Further, as compared with the substrate employed in the first example (above), the substrate 1104 is preferably extremely thin. A thin body can eliminate leakage current from source to drain. According to an exemplary embodiment, the substrate 1104 has a thickness of less than 10 nm, e.g., from about 2 nm to about 10 nm.

As shown in FIG. 11, the gate 1106 can be separated from the III-V channel material 1104 by a gate dielectric. According to an exemplary embodiment, the gate 1106 is a metal gate (which is made up of a single or multiple metal layers as is known in the art) and the gate dielectric is a single layer of a gate dielectric material such as (but not limited to) hafnium oxide, or alternatively the gate dielectric is made up of multiple layers of different dielectric materials. To form the gate, the gate material is deposited and then standard lithography techniques are used to pattern the gate 1106. For example, as shown in FIG. 11, a hardmask is used to pattern the gate line. As highlighted above, the gate material can be a metal or metals. Suitable gate metals include, but are not limited to titanium nitride (TiN), tantalum nitride (TaN), tungsten (W), gold (Au), titanium (Ti), aluminum (Al), platinum (Pt) and combinations including at least one of the foregoing metals.

As shown in FIG. 11, gate spacers are present on opposite sides of the gate 1106. According to an exemplary embodiment, the spacers are formed from a nitride material, such as (but not limited to) silicon nitride. Standard techniques are employed to form the spacers. For example, the spacer material can be blanket deposited over the structure and then patterned to form the spacers. In this case, since Schottky type contacts are being formed it is desirable to place the source drain contacts as close to the channel as possible. Thus, in this example, the spacers are formed having a thickness t2 of less than 15 nm, e.g., from about 1 nm to about 10 nm.

Self-aligned source and drain contacts with low contact resistance are then formed using the techniques described in conjunction with the description of FIGS. 1-5, above. Namely, to begin this contact-formation process, a metal or metals is/are deposited onto the III-V channel material 1104 on opposite sides of the gate 1106.

As described in detail above, suitable metal(s) deposited in this step include, but are not limited to, nickel, cobalt, titanium and/or platinum. Suitable metal deposition techniques include, but are not limited to, an evaporation technique, such as electron-beam (e-beam) evaporation, or sputtering. Next, as described above, an anneal is performed to react the metal with the III-V channel material 1104 forming metal-III-V alloy layers 1202 adjacent to the gate. See FIG. 12. According to an exemplary embodiment, the anneal is performed using a process including, but not limited to, rapid thermal annealing (RTA), furnace anneal or laser anneal is performed at a temperature of from about 60° C. to about 800° C. (e.g., from about 80° C. to about 400° C.) for a duration of from about 1 milli-second to about 2 hours (e.g., from about 1 second to about 60 minutes).

Figure 12:
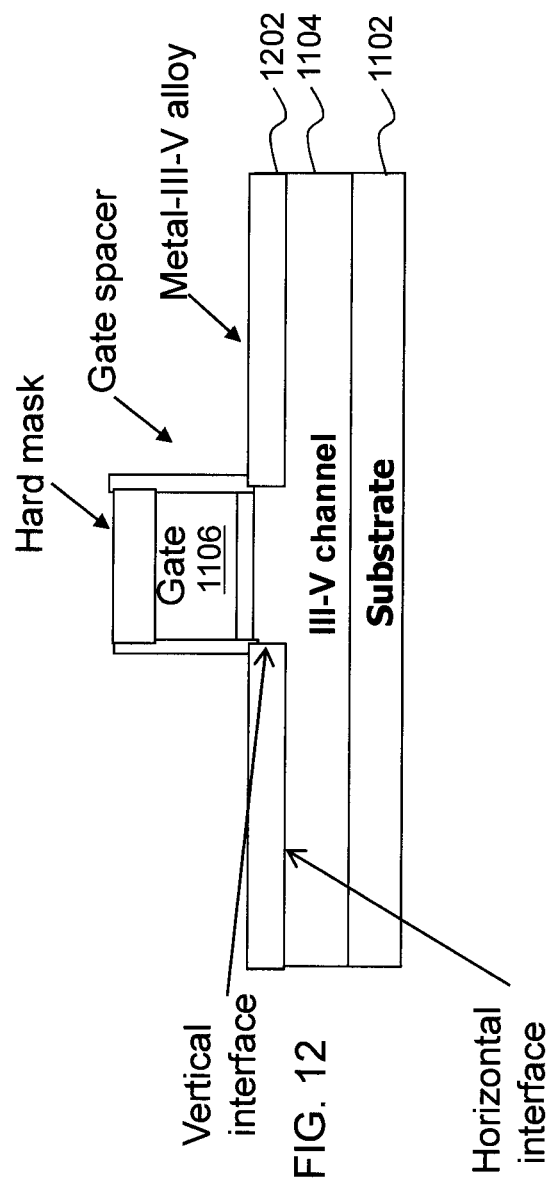
FIG. 12 is a cross-sectional diagram illustrating a metal(s) having been deposited onto the III-V channel material and then reacted (by annealing) with an upper portion of the III-V channel material forming a metal-III-V alloy layer, and wherein any unreacted portion of the metal(s) are etched away by selective etch, according to an embodiment of the present invention.

As highlighted above, some or all of the III-V material in the source and drain regions may be reacted with the metal to form the metal-III-V alloy. The exemplary configuration wherein only a (top) portion of the III-V material in the source and drain regions has been reacted with the metal to form the metal-III-V alloy is shown in FIG. 12. As shown in FIG. 12, the result is that a horizontal interface is created between the metal-III-V alloy layer and the unreacted III-V material thereunder, as well as a vertical interface between the metal-III-V alloy layer and the III-V material in the channel region. Alternatively, in the case where all of the III-V material in the source and drain regions is reacted with the metal to form the metal-III-V alloy (not shown), then only the vertical interface between the metal-III-V alloy layer and the III-V material in the channel region would be present since the metal-III-V alloy layer would extend down to the substrate in the source and drain regions.

This metal deposition and annealing technique results in the formation of self-aligned contacts since the metal-III-V alloy layer 1202 (the contact) will form only where the metal is deposited on the III-V channel material 1104. Any unreacted metal can be removed, for example, using a wet etch process (such as hydrochloric acid (HCL), hydrofluoric acid, piranha (sulfuric acid ($H_2SO_4$) and hydrogen peroxide ($H_2O_2$)) or standard RCA clean.

In order to reduce the contact resistance between the metal-III-V alloy layer 1202 (the contact) and the underlying III-V material 1104 (e.g., the channel material), an impurity or impurities will be placed at the interface between the metal-III-V alloy layer 1202 and the underlying III-V material 1104. This is accomplished by first implanting the impurity or impurities into the metal-III-V alloy layer 1202. See FIG. 13. As highlighted above, the term "impurity" as used herein refers generally to any element or elements that can be implanted into the metal-III-V alloy layer and diffused to the interface (see below) so as to reduce contact resistance. Dopants are considered to be one kind of impurity that can be used in accordance with the present techniques. By way of example only, in one exemplary embodiment, a dopant(s) including, but not limited to, silicon (Si), germanium (Ge), tin (Sn) and combinations including at least one of the foregoing elements, are employed as the impurity. Other impurities that have the right work function might also be used. These include, but are not limited to metals such as Erbium (Er), Ytterbium (Yb), Platinum (Pt) and combinations including at least one of the foregoing elements. Shallow implants are used to ensure that the dopants are confined to the metal-III-V alloy layer 1202.

Next an anneal is used to diffuse the implanted dopants to the interface between the metal-III-V alloy layer 1202 and the underlying III-V material 1104. See FIG. 14. According to an exemplary embodiment, a RTA, furnace anneal, DSA or LSA annealing process is employed. As highlighted above, this annealing step is performed at a low temperature, e.g., from about 300° C. to about 600° C. (e.g., from about 350° C. to about 450° C.), for a duration of from about 1 milli-second to about 2 hours, e.g., from about 1 second to about 30 minutes, so as to ensure that there will be at most negligible diffusion of the impurity/impurities into the underlying III-V material 1104. Therefore, the impurity/impurities will accumulate at the interface between the metal-III-V alloy layer 1202 and the underlying III-V material 1104. By segregating the impurity/impurities at the interface between the metal-III-V alloy layer 1202 and the underlying III-V material 1104, the contact resistance is greatly reduced (e.g., as compared to conventional processes, such as those described in del Alamo and Kim, the contents of each of which are incorporated by reference herein). The FET device is now complete.

Figure 15:
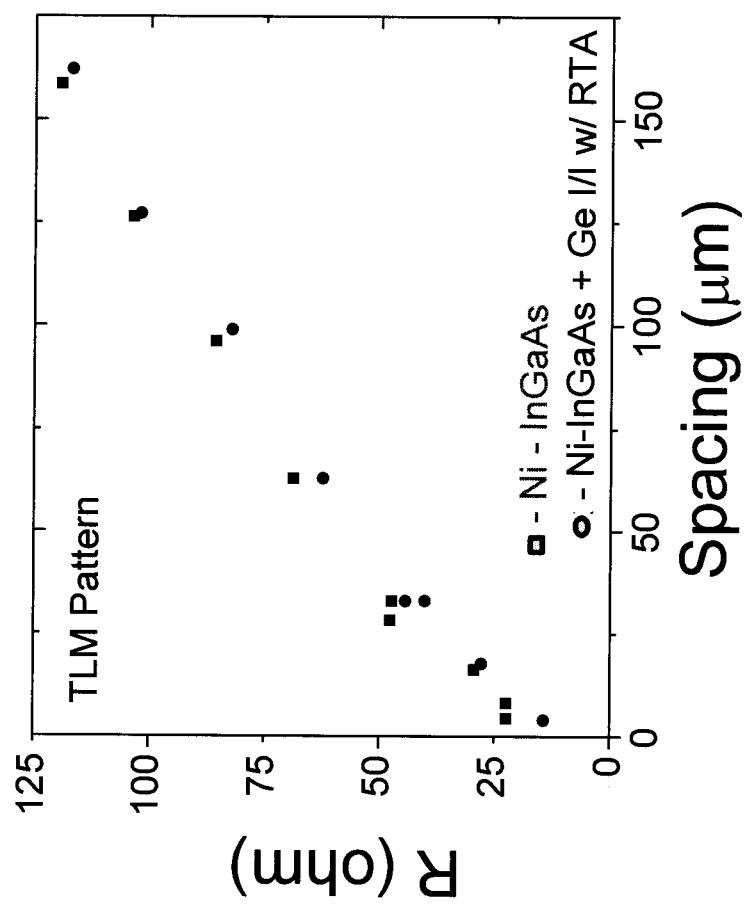
FIG. 15 is a graph illustrating device performance achieved using the present techniques according to an embodiment of the present invention.

FIG. 15 is a graph illustrating device performance achieved using the present techniques. In FIG. 15, spacing (measured in micrometers (μm)) is plotted on the x-axis and resistance (R) (measured in ohms) is plotted on the y-axis. As shown in FIG. 15, devices in which an impurity (in this case a germanium (Ge) dopant was diffused into the interface between the metal-III-V alloy layer and the underlying III-V material consistently showed lower resistance. Resistance in this example was measured using Transmission Line Measurements (TLM). TLM is a technique used to determine contact resistance and sheet resistance. The technique involves making a series of metal-semiconductor contacts separated by various distances (which is the spacing shown in FIG. 15). Probes are applied to pairs of contacts, and the resistance between them is measured by applying a voltage across the contacts and measuring the resulting current. The current flows from the first probe, into the metal contact, across the metal-semiconductor junction, through the sheet of semiconductor, across the metal-semiconductor junction again (except this time in the other direction), into the second contact. The resistance measured is a linear combination (sum) of the contact resistance of the first contact, the contact resistance of the second contact, and the sheet resistance of the semiconductor in-between the contacts.

As described above, devices with contacts produced using the present techniques, advantageously exhibit a significantly reduced contact resistance as compared with conventional approaches, such as those described in del Alamo and Kim. By way of example only, in one exemplary embodiment, devices are produced using the present techniques having source and drain contacts with a contact resistance of from about $1 \times 10^{-5}$ ohm $cm^2$ to about $1 \times 10^{-9}$ ohm $cm^2$.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a self-aligned contact to a III-V material, the method comprising the steps of:
    implanting one or more dopants into the III-V material to selectively form one or more separate and distinct implanted regions in the III-V material;
    after the implanted regions are formed, depositing at least one metal on a surface of the III-V material;
    reacting the at least one metal with an upper portion of the III-V material to form a metal-III-V alloy layer within the implanted regions which is the self-aligned contact, wherein the metal III-V alloy layers formed in the reacting step are confined to the implanted regions formed in the implanting step;
    using an etch to selectively remove any unreacted portions of the at least one metal;
    implanting at least one impurity into the metal-III-V alloy layer, wherein the at least one impurity implanted into the metal-III-V alloy layer is confined to the metal-III-V alloy layer; and
    diffusing the at least one impurity implanted into the metal-III-V alloy layer to an interface between the metal-III-V alloy layer and the III-V material thereunder to reduce a contact resistance of the self-aligned contact,
    wherein the at least one impurity comprises i) at least one dopant selected from the group consisting of silicon, germanium, tin and combinations comprising at least one of the foregoing elements, or ii) at least one metal selected from the group consisting of erbium, ytterbium, platinum and combinations comprising at least one of the foregoing metals.

2. The method of claim 1, wherein the III-V material is selected from the group consisting of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

3. The method of claim 1, wherein the at least one metal is selected from the group consisting of nickel, cobalt, titanium, platinum and combinations comprising at least one of the foregoing metals.

4. The method of claim 1, wherein the step of reacting the at least one metal with the upper portion of the III-V material comprises the step of:
    annealing the at least one metal and the III-V material at a temperature from about 60° C. to about 800° C. for a duration of from about 1 milli-second to about 2 hours.

5. The method of claim 4, wherein the at least one metal and the III-V material are annealed at a temperature of from about 80° C. to about 400° C. for a duration of from about 1 second to about 60 minutes.

6. The method of claim 1, wherein the etch used to selectively remove the unreacted portions of the at least one metal comprises a wet etching process comprising hydrochloric acid, hydrofluoric acid, or a combination of sulfuric acid and hydrogen peroxide.

7. The method of claim 1, wherein the step of diffusing the at least one impurity to the interface between the metal-III-V alloy layer and the III-V material comprises the step of:
    annealing the metal-III-V alloy layer and the III-V material at a temperature of from about 300° C. to about 600° C. for a duration of from about 1 milli-second to about 2 hours.

8. The method of claim 7, wherein the metal-III-V alloy layer and the III-V material are annealed at a temperature of from about 350° C. to about 450° C. for a duration of from about 1 second to about 30 minutes.

9. The method of claim 1, wherein the III-V material comprises a stack of layers with each of the layers containing a different one of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, or indium phosphide.

10. A method of fabricating a field-effect transistor (FET) device, the method comprising the steps of:
    depositing at least one layer of a III-V channel material on a substrate;
    forming a gate over the III-V channel material;
    forming spacers on opposite sides of the gate;
    implanting one or more source and drain dopants into the III-V channel material adjacent to the gate to selectively form separate and distinct implanted regions in the III-V channel material on opposite sides of the gate such that the implanted regions in the III-V channel material are separated from one another by a portion of the III-V channel material beneath the gate;
    after the implanted regions are formed, depositing at least one metal on a surface of the III-V channel material;
    reacting the at least one metal with an upper portion of the III-V material to form metal-III-V alloy layers adjacent to the gate within the implanted regions which serve as self-aligned source and drain contacts of the device, wherein the metal-III-V alloy layers formed in the reacting step are confined to the implanted regions formed in the implanting step;
    using an etch to selectively remove any unreacted portions of the at least one metal;
    implanting at least one impurity into the metal-III-V alloy layers, wherein the at least one impurity implanted into the metal-III-V alloy layers is confined to the metal-III-V alloy layers; and
    diffusing the at least one impurity implanted into the metal-III-V alloy layers to an interface between the metal-III-V alloy layers and the III-V material to reduce a contact resistance of the self-aligned source and drain contacts,
    wherein the at least one impurity comprises i) at least one dopant selected from the group consisting of silicon, germanium, tin and combinations comprising at least one of the foregoing elements, or ii) at least one metal selected from the group consisting of erbium, ytterbium, platinum and combinations comprising at least one of the foregoing metals.

11. The method of claim 10, wherein the III-V channel material is selected from the group consisting of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

12. The method of claim 10, wherein the substrate comprises a glass, metal or plastic substrate.

13. The method of claim 10, wherein the substrate is formed from a semiconducting material.

14. The method of claim 13, wherein the substrate has a thickness of from about 2 nm to about 10 nm.

15. The method of claim 10, wherein the gate comprises a metal gate.

16. The method of claim 10, wherein the gate is separated from the III-V channel material by a gate dielectric.

17. The method of claim 10, wherein the spacers have a thickness of from about 1 nm to about 10 nm.

18. The method of claim 10, wherein the at least one metal is selected from the group consisting of nickel, cobalt, titanium, platinum and combinations comprising at least one of the foregoing metals.

19. The method of claim 10, further comprising the step of:
   activating the one or more source and drain dopants implanted into the III-V channel material to form doped source and drain regions of the FET device,
   wherein the at least one metal is reacted with only an upper portion of the doped source and drain regions to form the metal-III-V alloy layer such that a portion of the doped source and drain regions remains beneath the metal-III-V alloy layer.

* * * * *